(12) United States Patent
Duan

(10) Patent No.: US 11,881,827 B2
(45) Date of Patent: Jan. 23, 2024

(54) TRAVELING-WAVE TRANSIMPEDANCE AMPLIFIER

(71) Applicant: CREDO TECHNOLOGY GROUP LIMITED, Grand Cayman (KY)

(72) Inventor: Yida Duan, Fremont, CA (US)

(73) Assignee: Credo Technology Group Limited, Grand Cayman (KY)

( * ) Notice: Subject to any disclaimer, the term of this patent is extended or adjusted under 35 U.S.C. 154(b) by 0 days.

(21) Appl. No.: 17/644,301

(22) Filed: Dec. 14, 2021

(65) Prior Publication Data
US 2023/0188106 A1   Jun. 15, 2023

(51) Int. Cl.
| H03F 3/55 | (2006.01) |
| H03F 3/60 | (2006.01) |
| H03F 1/42 | (2006.01) |
| H03F 3/45 | (2006.01) |

(52) U.S. Cl.
CPC .............. *H03F 3/55* (2013.01); *H03F 1/42* (2013.01); *H03F 3/45076* (2013.01); *H03F 2200/36* (2013.01)

(58) Field of Classification Search
CPC .......... H03F 3/55; H03F 1/42; H03F 3/45076; H03F 2200/36
USPC .......................................... 330/286, 295, 54
See application file for complete search history.

(56) References Cited

U.S. PATENT DOCUMENTS

| 6,342,815 B1 * | 1/2002 | Kobayashi | H03F 3/605 330/54 |
| 6,844,784 B1 | 1/2005 | Denoyer | |
| 7,271,657 B2 | 9/2007 | Friedrich et al. | |

OTHER PUBLICATIONS

Transimpedance amplifier. Wikimedia Foundation. (Sep. 21, 2021). 7 pages; Retrieved Dec. 14, 2021, from https://en.wikipedia.org/wiki/Transimpedance_amplifier.

* cited by examiner

*Primary Examiner* — Hieu P Nguyen
(74) *Attorney, Agent, or Firm* — Ramey LLP; Daniel J. Krueger

(57) ABSTRACT

One illustrative high bandwidth transimpedance amplifier includes a distributed amplifier having multiple transistors that receive a propagating input signal at respective nodes of an input signal line and drive corresponding nodes of an amplified signal line that propagates an amplified signal to an output voltage buffer. A feedback impedance couples the output voltage to a feedback node in the distributed amplifier, making the output voltage proportional to the input signal's current. An illustrative method includes: propagating an input signal current along an input signal line of a distributed amplifier, the distributed amplifier responsively propagating an amplified signal along an amplified signal line; buffering the amplified signal from a final node of the amplified signal line to produce an output voltage signal; and using the output voltage signal to draw the input signal current from a final node of the input signal line via a feedback impedance.

17 Claims, 2 Drawing Sheets

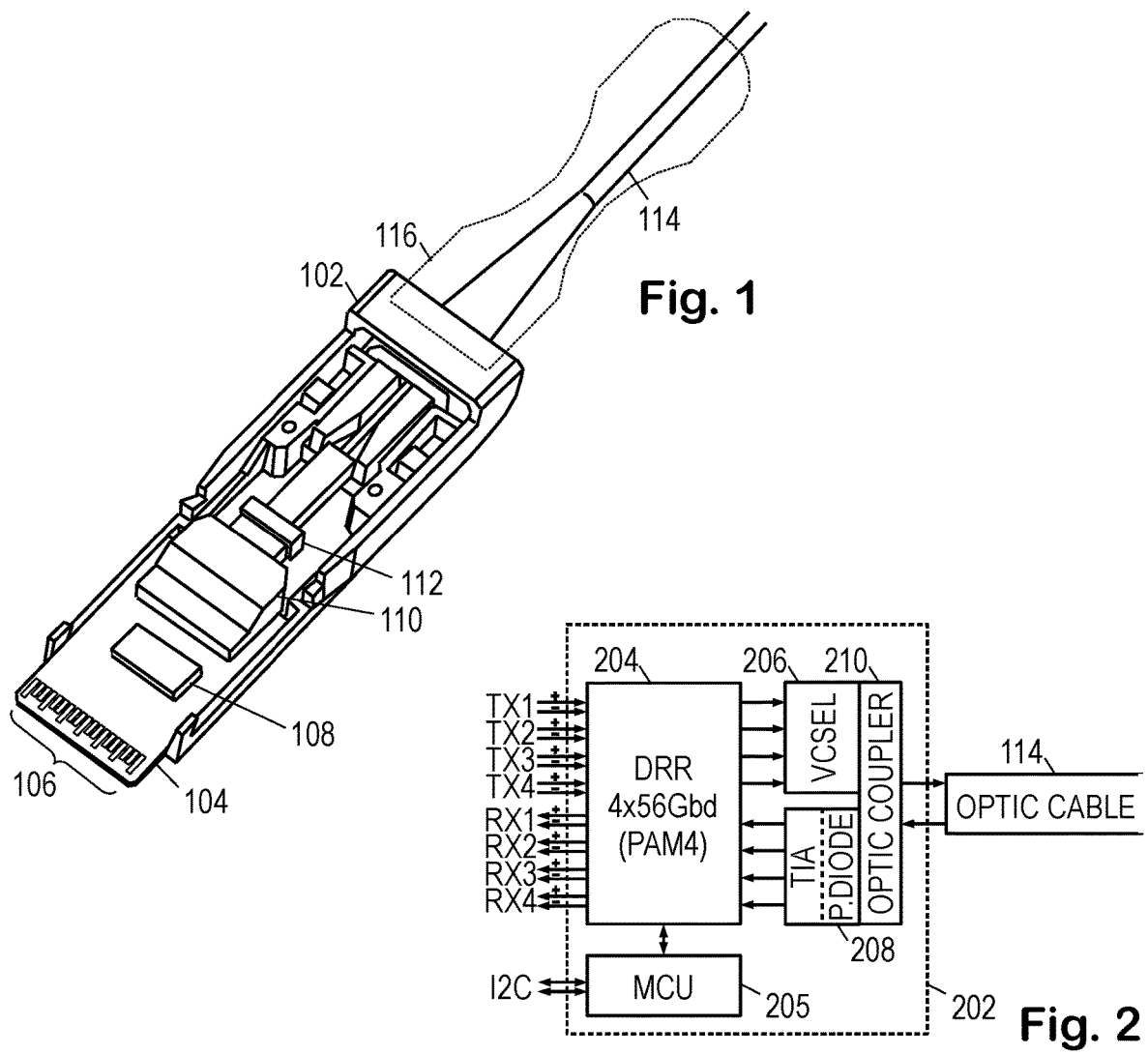
Fig. 1
Fig. 2
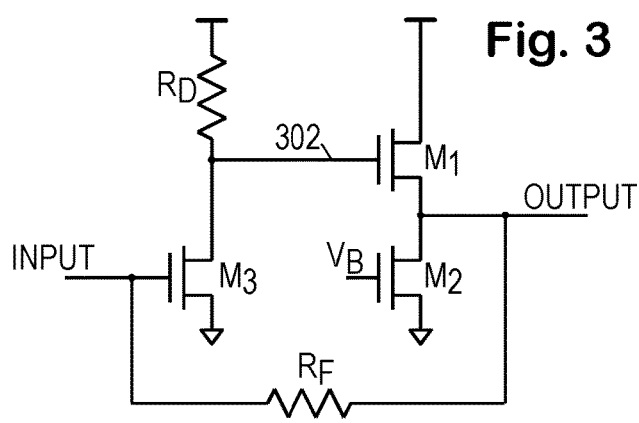
Fig. 3

TRAVELING-WAVE TRANSIMPEDANCE AMPLIFIER

BACKGROUND

Demand continues for ever-increasing volumes and rates of data communication, a demand that is gradually being addressed by sophisticated techniques for transmitting and receiving ever-higher frequency and higher-bandwidth signals through various forms of wireless and physical media. For example, the bandwidth limitations of fiberoptic channels are often determined by the capabilities of the electronic components at each end rather than by the properties of the optical fibers that actually form the channel itself. Where the performances of these electronic components can be enhanced, the channel can support higher bandwidth communications.

The transimpedance amplifier (TIA) is a critical component of high bandwidth fiberoptic receivers. The TIA is a current-to-voltage converter, which is desirable for sensors such as photodiodes and other photodetectors having a current response that is more linear than their voltage response. Notably, the relationship between light intensity and photocurrent in a photodiode is fairly linear for a given reverse-bias voltage. The TIA presents a low input impedance while isolating the photodiode from output voltage variation, thereby stabilizing the reverse-bias voltage and optimizing the photodetector response.

Complementary metal-oxide semiconductor (CMOS) processes are usually employed for high bandwidth electronic components because they generally offer fast, efficient switching that can support processing of high bandwidth signals. However, the transistors created with such processes typically have a significant gate capacitance. In a TIA with an input transistor sufficiently sized to mitigate input-referred noise, the input transistor's gate capacitance combines with the feedback resistance to form a (bandwidth-limiting) low pass filter as described in Wikipedia's entry on the Transimpedance Amplifier. This issue may undesirably limit the communications bandwidth of fiberoptic channels and other systems employing existing TIA designs.

SUMMARY

Accordingly, there are disclosed herein traveling-wave transimpedance amplifiers and methods that reduce the impact of input transistor gate capacitance and thereby increase their signal bandwidth. One illustrative high bandwidth transimpedance amplifier includes: a voltage buffer, a distributed amplifier, and a feedback impedance. The voltage buffer is coupled to an output node to supply an output voltage signal. The a distributed amplifier has an input signal line that propagates an input signal, and multiple transistors that receive the input signal at respective nodes of the input signal line and responsively drive corresponding nodes of an amplified signal line that propagates an amplified signal to the voltage buffer. The feedback impedance couples the output node to a feedback node in the distributed voltage amplifier, causing the output voltage signal to be proportional to the input signal's current.

Another illustrative transimpedance amplifier includes: a set of input signal line inductances being connected in series if the set has more than one inductance, each amplified signal line inductance being coupled between two nodes in an input signal line; a set of amplified signal line inductances being connected in series if the set has more than one inductance, each amplified signal line inductance being coupled between two nodes in an amplified signal line; a common-drain amplifier that buffers a voltage from a final node in the amplified signal line to drive an output node; a set of two or more transistors each having a having a gate connected to a respective node in the input signal line to receive a current signal propagating along the input signal line, each transistor further having a drain connected to a respective node in the amplified signal line to responsively propagate a voltage signal along the amplified signal line to a gate of the output transistor; and a feedback impedance that couples the output node to a final node in the input signal line, the output node producing a voltage signal that draws the current signal to the output node through the feedback impedance.

An illustrative method includes: propagating an input signal current along an input signal line of a distributed amplifier, the distributed amplifier responsively propagating an amplified signal along an amplified signal line; buffering the amplified signal from a final node of the amplified signal line to produce an output voltage signal; and using the output voltage signal to draw the input signal current from a final node of the input signal line via a feedback impedance.

Each of the foregoing may be implemented individually or in combination, and may be implemented with any one or more of the following features in any suitable combination: 1. the input signal line includes a first set of inductors that couple the respective nodes of the input signal line in series. 2. the amplified signal line includes a second set of inductors that couple the corresponding nodes of the amplified signal line in series. 3. one of said multiple transistors is a final transistor that receives the input signal from a final node of the input signal line and drives a final node of the amplified signal line. 4. the voltage buffer buffers a voltage of the final node of the amplified signal line. 5. the feedback node is the final node of the input signal line. 6. one of said multiple transistors is an initial transistor that receives the input signal from an initial node of the input signal line and drives an initial node of the amplified signal line. 7. the inductors in the first set of inductors each have an inductance $L_G$, and each of the inductors in the second set of inductors each have an inductance $L_D$. 8. the input signal is coupled to the initial node of the input signal line via an input inductance of $L_G/2$. 9. the feedback impedance includes a feedback resistance and a feedback inductance of $L_G/2$. 10. the multiple transistors of the distributed voltage amplifier are each configured as common source amplifiers. 11. an initial pull-up impedance is coupled to the initial node of the amplified signal line and a final pull-up impedance is coupled to the final node of the amplified signal line. 12. the initial and final pull-up impedances each include a pull-up resistance and a pull-up inductance of $L_D/2$. 13. a bias circuit that biases the multiple transistors of the distributed voltage amplifier via the initial and final pull-up impedances. 14. a bias circuit that biases the drains of the two or more transistors via the amplified signal line. 15. the voltage buffer is a common-drain amplifier. 16. said propagating an input signal employs series-connected inductors that each couple two transistor gate capacitances of the distributed amplifier. 17. said propagating an amplified signal employs series-connected inductors that each couple two transistor drain capacitances of the distributed amplifier.

BRIEF DESCRIPTION OF THE DRAWINGS

FIG. 1 is a perspective view of an illustrative fiberoptic cable connector.

FIG. 2 is a block diagram of an illustrative fiberoptic cable connector.

FIG. 3 is a schematic of an illustrative transimpedance amplifier (TIA).

DETAILED DESCRIPTION

Figure 4:
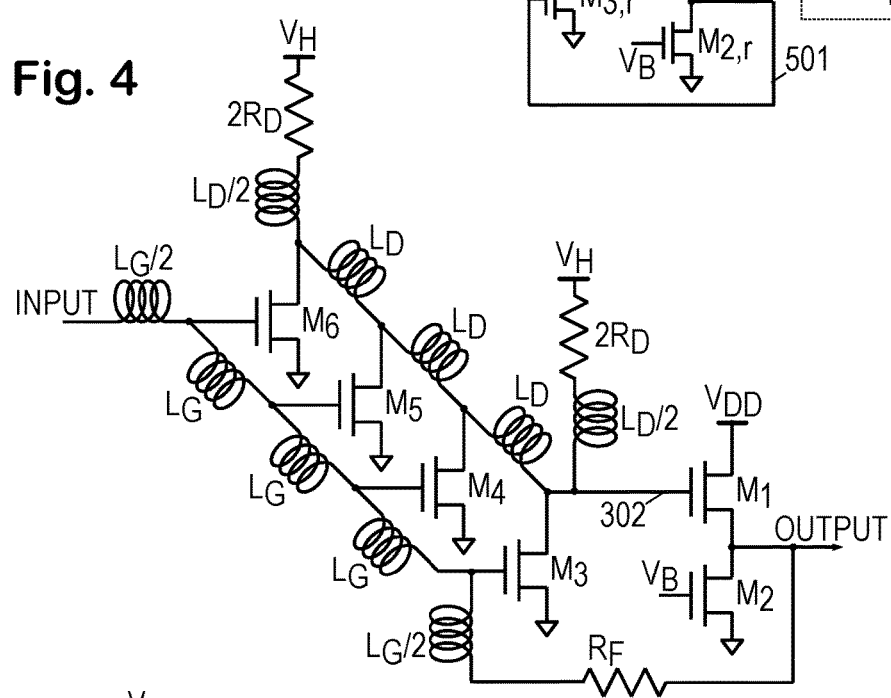
FIG. 4 is a schematic of an illustrative traveling wave TIA.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

As an illustrative usage context, FIG. 1 shows a fiberoptic cable connector such as might be used to connect computers and network devices in a data processing center. A connector frame 102 houses a printed circuit board (PCB) assembly 104 configured with edge connector contacts 106. Edge connector contacts 106 mate with contacts in a socket of a host device's network interface port to send and receive electrical signals. The PCB assembly 104 includes one or more packaged integrated circuit (IC) chips or discrete electrical components mounted to contact pads on the PCB. For example, the PCB assembly 104 may include a digital data recovery and remodulation (DRR) device 108 that equalizes received signals, recovers the data, and retransmits the recovered data with optional error correction, signal format conversion, and lane realignment.

The PCB assembly 104 includes an optical coupling module 110 that couples integrated photodetectors and photoemitters to one or more optical paths. When mated with the optical coupling module 110, a ferrule 112 aligns one or more optical fibers the fiberoptic cable 114 with the one or more optical paths. The optical coupling module 110 would typically use lenses and prisms to define the optical paths that couple light signals between the optical fibers and the photodetectors and photoemitters, though other optical elements (e.g., mirrors, gratings) would also be suitable.

Though not shown here, the fiberoptic cable connector may further include a cover and a finger grip 116 to protect the other components from damage during normal use.

FIG. 2 is a block diagram to more clearly illustrate the signal flows of an illustrative fiberoptic cable connector 202. A DRR device 204 couples to the network interface port to accept, as an example, 28 or 56 gigabaud (GBd) electrical transmit signals from the host on each of four lanes and to provide the host with 28 or 56 GBd electrical receive signals on each of four lanes. The electrical transmit and receive signals are differential signals that may employ non-return to zero (NRZ) signaling or 4-level pulse amplitude modulation (PAM4) signaling. After accounting for overhead, four signal lanes in this example collectively transport data at a nominal 100 or 200 gigabits per second (Gbps) for NRZ and 200 or 400 Gbps for PAM4.

The connector 202 may further include a microcontroller unit (MCU) 205 that couples to the network interface port via a management data bus such as the inter-integrated circuit (I2C) bus or the management data input/output (MDIO) bus. The host may use the management data bus to identify the cable's capabilities, determine connection status, diagnose faults, and/or configure operation of the cable connector. The MCU 205 processes commands received via the management data bus to appropriately read or set the control registers of the DRR device 204. In at least some cases, the MCU 205 is integrated into the DRR device 204.

Optical coupling module 110 (FIG. 1) includes photoemitter array 206, optical path coupler 210, and photodetector array 208. DRR device 204 converts the electrical transmit signals into remodulated electrical transmit signals that drive an array of photoemitters 206. As one example, the photoemitters in the array are vertical cavity surface-emitting lasers (VCSEL). The electrical drive signals cause current flow in the photoemitters, which in turn emit light signals having an intensity corresponding to the amplitude of the current flow.

An optical path coupler 210 optically couples the light signals from the photoemitters to optical fibers in cable 114 and couples light signals from optical fibers cable 114 to an array of photodetectors 208. Various suitable photodetector implementations are available in the literature. As one example, the photodetectors in the array are reverse-biased photodiodes that each produce a photocurrent signal corresponding to the intensity of a received light signal. A transimpedance amplifier (TIA) converts the photocurrent signal into a voltage signal, amplifying the signal while isolating the photodiode from output voltage variation. In this fashion, the modulated optical signal intensity is converted into a modulated voltage signal for the DRR device to equalize and demodulate into a digital data stream.

FIG. 3 shows an illustrative TIA, which includes an output node driven by output transistor $M_1$ in a source follower (aka common-drain amplifier) configuration to buffer the voltage signal on intermediate node 302. A second transistor $M_2$ is coupled to the output node, biased with a bias voltage $V_B$ to act as a current sink and minimize the TIA's output impedance.

A third transistor $M_3$ operates in a common-source amplifier configuration to drive the intermediate node 302 with an amplified version of the voltage signal on the input node. A drain resistor $R_D$ determines the gain of the common-source amplifier, but potentially limits the output impedance of the common-source amplifier configuration (hence the inclusion of transistors $M_1$, $M_2$).

A feedback resistor $R_F$ couples the output node to the input node. The feedback resistor closely connects the output voltage to the input signal current, causing the output voltage $V_o$ to be essentially proportional to the input signal current $I_{IN}$ so as to draw the input signal current through the feedback resistor $R_F$. The output voltage can be expressed as $V_o = -R_F * I_{IN}$. The feedback arrangement makes the voltage of the input node insensitive to the input current and isolated from the voltage of the output node, at least for low frequencies.

The feedback resistor $R_F$ combines with the gate capacitance of transistor $M_3$ to form a low pass filter, attenuating high frequency components of the input signal current. Other considerations (i.e., input-referred noise) prevent the feedback resistance and input transistor size from being reduced to sufficiently raise the filter cutoff frequency. Accordingly, the inventor proposes to employ a distributed amplifier (aka "traveling wave amplifier") to reduce the apparent input gate capacitance and thereby reduce attenuation of high frequency signal components.

FIG. 4 shows an illustrative traveling wave TIA. The input transistor $M_3$ of FIG. 3 is replaced in FIG. 4 with a set of multiple transistors connected in a distributed amplifier arrangement. Four transistors $M_3$-$M_6$ are shown here, but the number of transistors can be any integer higher than one. Collectively, the multiple transistors may have about the same channel area as the input transistor $M_3$ of FIG. 3. Thus, for example, the four transistors $M_3$-$M_6$ of FIG. 4 may each have a channel width (and gate capacitance) about one-quarter that of the input transistor $M_3$ of FIG. 3, and may otherwise share similar dimensions, e.g., dielectric thickness, doping profile, and channel length.

The distributed amplifier arrangement causes the multiple transistors $M_3$-$M_6$ to operate sequentially as the input signal propagates along an input signal line formed by a set of inductors $L_G$ connecting the transistor gates in series. This arrangement of inductors and gate capacitances emulates the behavior of a transmission line, passing the signal from node to node (and gate to gate) with a characteristic propagation delay (approximately $\sqrt{L_G C_G}$) and essentially no attenuation.

The inductors $L_G$ are sized in connection with the gate capacitances $C_G$ to present a matched impedance to the source of the input signal, e.g., 50 ohms. (The impedance matching need not be exact; a 6 dB match has been observed to perform adequately.) The characteristic transmission line impedance calculation, which may be used as a rule of thumb, is:

$$Z_0 = \sqrt{\frac{L_G}{C_G}}.$$

However, parasitic effects and other design considerations may motivate the use of an adjusted $L_G$ value.

The inductors $L_G$ in the input signal line provide isolation of the gate capacitances $C_G$ from the input signal source and from the feedback signal, relaxing the bandwidth limitations that might otherwise be imposed by combining gate capacitances with the resistances in the input and feedback paths. Additional inductors $L_G/2$ may be optionally provided at the input end of the input signal line and in the feedback path to further isolate the gate capacitance effects of the distributed amplifier's initial and final transistors $M_6$, $M_3$.

As the multiple transistors $M_3$-$M_6$ receive the input signal at their respective gates, they produce an amplified voltage signal at their drains. The drains are connected by a series of inductors $L_D$ which form an amplified signal line to propagate the respective amplified voltage signal to the intermediate node 302 at the same propagation rate as the input signal line. This propagation rate matching causes the amplified voltage signals from the multiple transistors to combine additively at intermediate node 302. As in FIG. 3, output transistor $M_1$ is configured as a source follower to drive the output node, thereby buffering the voltage signal from intermediate node 302.

The inductors $L_D$ for the amplified signal line are sized in connection with the transistors' intrinsic drain capacitances $C_D$ to provide a characteristic propagation delay (approximately $\sqrt{L_D C_D}$) matching that of the input signal line (approximately $\sqrt{L_G C_G}$). As with the impedance matching, the amplifier may perform well even if the propagation delays aren't exactly matched.

Though the foregoing description of the signal lines presumes reliance on only inductor elements and intrinsic capacitances, it should be recognized that the design permits the inclusion of additional capacitive elements to separately adjust the gate and/or drain capacitances.

To properly bias the multiple transistors $M_3$-$M_6$, a bias voltage $V_H$ is coupled to the amplified signal line via one or more pull-up impedances. In FIG. 4, the initial and final nodes of the amplified signal line are each coupled to the bias voltage $V_H$ via a pull-up impedance that includes a resistance $2R_D$ and an inductance $L_D/2$.

Figure 5:
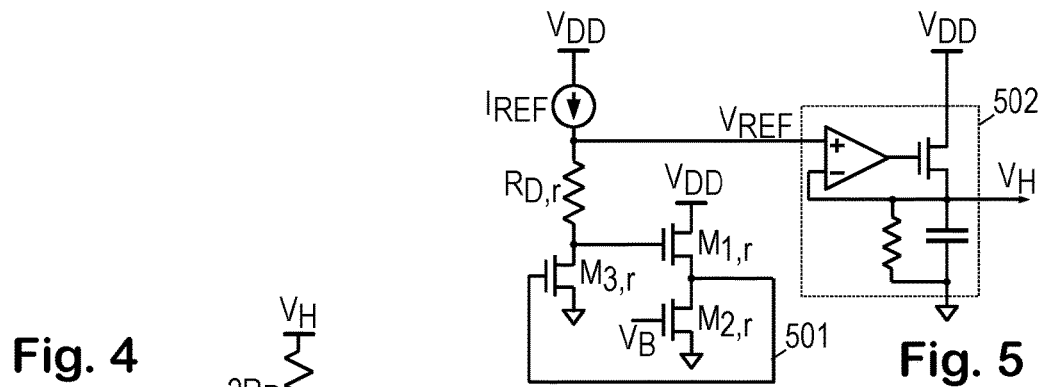
FIG. 5 is a schematic of an illustrative bias circuit.

The disclosed amplifiers perform best (most linearly) when the various transistors $M_1$-$M_6$ are in saturation. Transistor $M_2$ is directly controlled by a bias voltage $V_B$, which may be generated using a standard Widlar or Wilson current mirror or any well-known variation thereof. FIG. 5 shows an illustrative circuit to generate a bias voltage $V_H$ for the distributed amplifier.

The bias circuit of FIG. 5 includes a set of "replica" transistors $M_{1,r}$-$M_{3,r}$. These replica transistors are matched to transistors $M_1$-$M_3$, but because their only purpose is to provide a voltage reference the replica transistors may be scaled to a smaller dimension to reduce power consumption. Transistor $M_{2,r}$ is biased with bias voltage $V_B$ to act as a current sink from a replica output node 501. Transistor $M_{1,r}$ operates in a source follower configuration to control the voltage of the replica output node 501. The replica output node voltage is connected to the gate of common-source configured transistor $M_{3,r}$, which cooperates with drain resistor $R_{D,r}$ to control the gate voltage of $M_{1,r}$.

A current source $I_{REF}$ drives a current through the drain resistor $R_{D,r}$, raising the gate voltage of $M_{1,r}$ which in turn raises the gate voltage of $M_{3,r}$ until the common source amplifier conducts the desired amount of current (i.e., $I_{REF}$). At this point, the drain voltage of $M_{3,r}$ combines with the voltage drop across the drain resistor $R_{D,r}$ to define a reference voltage $V_{REF}$. A voltage regulator 502 then regulates the a bias voltage node $V_H$ to match the reference voltage $V_{REF}$. FIG. 5 shows voltage regulator 502 as a low dropout (LDO) regulator, but any suitable regulator configuration may be used.

Figure 6:
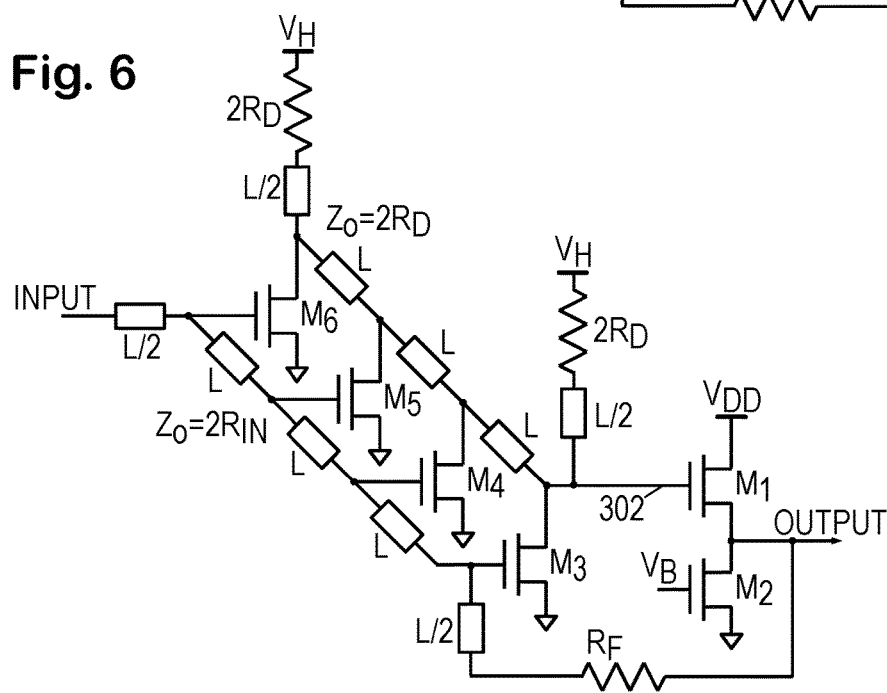
FIG. 6 is a schematic of another illustrative traveling wave TIA.

FIG. 6 shows another illustrative traveling wave TIA. In this implementation, transmission line segments replace the lumped inductor elements of FIG. 4. The transmission line segments of the input signal line are designed to have a characteristic impedance Zo equal to the desired input impedance for the TIA, e.g., 50 ohms. The transmission line segments of the amplified signal line are designed to have a characteristic impedance matching the pull-up resistors, e.g., $2R_D$.

Note that in FIG. 6, the label L refers to the length of the transmission line segments rather than the inductance. As the same process is used to construct the transmission line segments for both the input signal line and the amplified signal line, their propagation rates will be roughly the same, causing their propagation delays to be primarily determined by the length of the transmission line segments.

The input signal line components and amplified signal line components, whether implemented as lumped inductors or as transmission line segments, will in practice demonstrate a behavior somewhere in between the two. Standard circuit simulation techniques may be used to model the performance of the traveling wave TIA and to refine the performance with adjustments of the parameter values for the signal line components.

By lowering the effective input capacitance, the traveling wave TIA in any case enables an significantly increased bandwidth relative to the TIA design of FIG. 3, and does so at little or no cost in terms of input-referred noise and power consumption.

Numerous alternative forms, equivalents, and modifications will become apparent to those skilled in the art once the above disclosure is fully appreciated. For example, the present disclosure shows the use of n-type metal oxide semiconductor field effect transistors ("nMOS" or "n-MOSFETs") due to the availability and speed of such transistors in existing CMOS processes, but it is recognized that the disclosed principles are applicable with other transistor types wherever they are available. As more specific examples, the disclosed circuits can be implemented with junction field effect transistors (JFETs) and bipolar junction transistors (BJTs) in silicon and other semiconductors with n-type, p-type, and mixtures of both. It is intended that the claims be interpreted to embrace all such alternative forms, equivalents, and modifications that are encompassed in the scope of the appended claims.

What is claimed is:

1. A high bandwidth transimpedance amplifier that comprises:
 a voltage buffer coupled to an output node to supply an output voltage signal;
 a distributed amplifier having an input signal line that propagates an input signal, the distributed amplifier further having multiple transistors that receive the input signal at respective nodes of the input signal line and operate to drive corresponding nodes of an amplified signal line that propagates an amplified signal to the voltage buffer, the input signal line having a first set of inductors that couple said respective nodes in series, the amplified signal line having a second set of inductors that couple said corresponding nodes in series, and one of said multiple transistors being a final transistor that receives the input signal from a final node of the input signal line and drives a final node of the amplified signal line, the voltage buffer operating to buffer a voltage of the final node of the amplified signal line; and
 a feedback impedance that couples the output node to a the final node of the input signal line, causing the output voltage signal to be proportional to the input signal's current.

2. The high bandwidth transimpedance amplifier of claim 1, wherein one of said multiple transistors is an initial transistor that receives the input signal from an initial node of the input signal line and drives an initial node of the amplified signal line, wherein the inductors in the first set of inductors each have an inductance Lg, and wherein the input signal is coupled to the initial node of the input signal line via an input inductance of Lg/2.

3. The high bandwidth transimpedance amplifier of claim 2, wherein the feedback impedance includes a feedback resistance and a feedback inductance of Lg/2.

4. The high bandwidth transimpedance amplifier of claim 2, wherein the multiple transistors of the distributed amplifier are each configured as common source amplifiers.

5. The high bandwidth transimpedance amplifier of claim 4, wherein the inductors in the second set of inductors each have an inductance Ld, wherein an initial pull-up impedance is coupled to the initial node of the amplified signal line and a final pull-up impedance is coupled to the final node of the amplified signal line, and wherein the initial and final pull-up impedances each include a pull-up resistance and a pull-up inductance of Ld/2.

6. The high bandwidth transimpedance amplifier of claim 5, further comprising a bias circuit that biases the multiple transistors of the distributed amplifier via the initial and final pull-up impedances.

7. The high bandwidth transimpedance amplifier of claim 1, wherein the voltage buffer is a common-drain amplifier.

8. A transimpedance amplifier that comprises:
 a set of input signal line inductances being connected in series if the set has more than one inductance, each amplified signal line inductance being coupled between two nodes in an input signal line;
 a set of amplified signal line inductances being connected in series if the set has more than one inductance, each amplified signal line inductance being coupled between two nodes in an amplified signal line;
 an output transistor in a common-drain amplifier configuration to drive an output node;
 a set of two or more transistors each having a having a gate connected to a respective node in the input signal line to receive a current signal propagating along the input signal line, each transistor further having a drain connected to a respective node in the amplified signal line to responsively propagate a voltage signal along the amplified signal line to a gate of the output transistor; and
 a feedback impedance that couples the output node to a final node in the input signal line, the output node producing a voltage signal that draws the current signal to the output node through the feedback impedance.

9. The transimpedance amplifier of claim 8, further comprising a bias circuit that biases the drains of the two or more transistors via the amplified signal line.

10. The transimpedance amplifier of claim 9, wherein the bias circuit couples to initial and final nodes of the amplified signal line with initial and final pull-up impedances.

11. The transimpedance amplifier of claim 10, wherein the amplified signal line inductances each have an value Ld, wherein the initial and final pull-up impedances each include a pull-up resistance and a pull-up inductance of Ld/2.

12. The transimpedance amplifier of claim 8, wherein the input signal line inductances each have an value Lg, and wherein the input signal is coupled to an initial node of the input signal line via an input inductance of Lg/2.

13. The transimpedance amplifier of claim 12, wherein the feedback impedance includes a feedback resistance and a feedback inductance of Lg/2.

14. A method that comprises:
 propagating an input signal current along an input signal line of a distributed amplifier, the distributed amplifier responsively propagating an amplified signal along an amplified signal line;
 buffering the amplified signal from a final node of the amplified signal line to produce an output voltage signal; and
 using the output voltage signal to draw the input signal current from a final node of the input signal line via a feedback impedance.

15. The method of claim 14, wherein said propagating an input signal employs series-connected inductors that each couple two transistor gate capacitances of the distributed amplifier.

16. The method of claim 15, wherein said propagating an amplified signal employs series-connected inductors that each couple two transistor drain capacitances of the distributed amplifier.

17. The method of claim 14, wherein said buffering employs a common-drain amplifier.

* * * * *